United States Patent [19]

Morgan

[11] Patent Number: 4,745,457
[45] Date of Patent: May 17, 1988

[54] ELECTRONIC SUBSTRATE ARTICLE AND METHOD OF PREPARATION

[75] Inventor: Charles G. Morgan, Laurens, S.C.

[73] Assignee: General Electric Company, New York, N.Y.

[21] Appl. No.: 635,996

[22] Filed: Jul. 30, 1984

[51] Int. Cl.$^4$ .............................................. H01L 39/02
[52] U.S. Cl. .................................. 357/80; 174/137 B; 501/127
[58] Field of Search ....................... 501/127, 128, 134; 174/137 B; 357/80

[56] References Cited

U.S. PATENT DOCUMENTS

| | | | |
|---|---|---|---|
| 2,308,115 | 1/1943 | Schwartzwalder et al. | 501/135 |
| 3,844,803 | 10/1974 | Blanke et al. | 501/128 |
| 3,955,023 | 5/1976 | Blakely | 428/209 X |
| 4,149,899 | 4/1979 | Crookston | 501/128 |

FOREIGN PATENT DOCUMENTS 415579 8/1934 United Kingdom ................. 501/127
446488 10/1974 U.S.S.R. ............................. 501/127

OTHER PUBLICATIONS

*Alumina as a Ceramic Material*, Walter H. Gitzen, 1970, pp. 130–134.

Primary Examiner—Steven Capella
Attorney, Agent, or Firm—S. C. Corwin; B. E. Morris

[57] ABSTRACT

An electronic substrate is provided in the form of a sintered body of polycrystalline alumina ceramic which further contains up to approximately 4% glass forming oxide selected from $SiO_2$, MgO and $ZrO_2$ along with about 0.4–2.0% refractory metal oxide to substantially reduce visible transmission in said substrate. In a preferred embodiment, said substrate comprises an elongated member of the ceramic material such as a flat layer which further includes a central cavity region housing an integrated circuit component such as a chip in which may be further provided with cover means for the central cavity in said member that can be formed with the same ceramic.

2 Claims, 1 Drawing Sheet

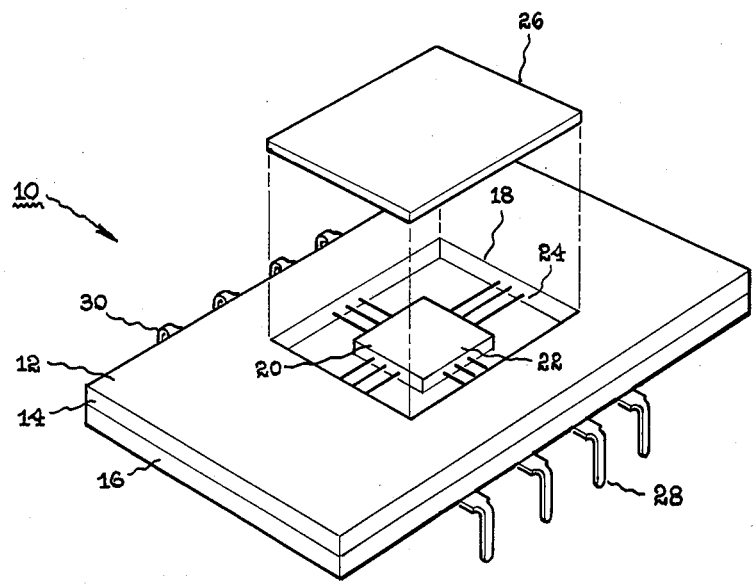

ELECTRONIC SUBSTRATE ARTICLE AND METHOD OF PREPARATION

BACKGROUND OF THE INVENTION

Electronic substrates have previously been formed with various alumina base ceramics including one material containing in approximate weight percent based on the starting batch formulation about 93% $Al_2O_3$, 4.6% $SiO_2$, 0.76% CaO, 0.8% MgO and 0.85% $MoO_3$ which produced a final sintered article having a black color. Since higher alumina content ceramic materials were subsequently found to exhibit superior electrical and physical characteristics for electronic substrate applications, however, it would be desirable to further modify these ceramics without degrading the aforementioned superior characteristics to obtain still other benefits. Such higher performance electronic substrate alumina based ceramics are now frequently combined with integrated circuit components which either degrade in performance due to light exposure or are designed to be actuated with visible light. Accordingly, it would be desirable to reduce the light transmission in the ceramic substrate itself as a means of protecting any light-sensitive circuit components from exposure except when desired.

SUMMARY OF THE INVENTION

It has now been discovered that properly controlled amounts of a refractory metal oxide can be introduced uniformly into a particular alumina ceramic material to reduce the visible light transmission therein without substantially altering the desired electrical and physical characteristics for general purpose electronic substrate applications. Specifically, from about 0.4 weight percent up to about 2.0 weight percent refractory metal oxide is added to a ceramic batch comprising alumina particles containing up to about 4 weight percent glass forming oxides selected from $SiO_2$, MgO and $ZrO_2$ and said batch mixture thereafter sintered at elevated temperatures in a reducing atmosphere to form an electronic substrate article that is substantially opaque to visible light transmission. The shape of said electronic substrate article can be formed prior to sintering with conventional techniques including dry pressing, extrusion, and injection molding. Thereafter, the shaped article can be sintered in a conventional controlled atmosphere furnace such as hydrogen at a temperature in the approximate range 1500°–1600° C. to produce a black colored ceramic generally useful as a chip carrier, multilayer substrate, thick film substrate and the like.

In its preferred embodiments, the refractory metal oxide additive is $MoO_3$ which is incorporated into a batch mixture consisting essentially of 96.0% $Al_2O_3$, 2.0% $SiO_2$, 1.0% MgO and 0.6% $ZrO_2$. The final sintered article produced in the above indicated manner with said alumina batch mixture is found to have grains of alumina sintered together with a secondary phase containing said $SiO_2$, MgO and $ZrO_2$ constituents disposed at the boundaries of said alumina grains and with said refractory metal oxide also being dissolved in said secondary phase uniformly throughout the sintered ceramic composition. A preferred shape of the electronics substrate formed with said modified alumina ceramic material comprises an elongated flat member having a central cavity region in which can be housed an integrated circuit chip. Said preferred electronic substrate still further includes cover means for the central cavity in said member and which can be formed with the same ceramic material in order to fully protect the internally housed electronic component from light exposure.

BRIEF DESCRIPTION OF THE DRAWING

The accompanying drawing represents a typical ceramic chip package employing the modified alumina base ceramic of the present invention.

DESCRIPTION OF THE PREFERRED EMBODIMENT

Referring to the accompanying drawing, there is depicted a representative ceramic chip package 10 generally comprising a multi-layer elongated flat ceramic substrate 12 according to the present invention with individual layers 14 and 16 being sintered together and electrically interconnected all in the conventional manner. Said ceramic substrate 12 further includes a central cavity region 18 which houses a semiconductor device 20 in the form of an integrated circuit chip 22 having terminal lead wires 24 being electrically connected to a circuit pattern (not shown) deposited on one or more layers of said electronic substrate. The ceramic chip package 10 further includes a flat cover member 26 also formed in accordance with the present invention and which is either bonded to the top major surface of said electronic substrate member or is inserted into its central cavity opening for bonding therein all again in the conventional manner. Side terminal leads 28 and 30 are also joined electrically to the circuit pattern of said electronic substrate 12 for external electrical connection to the overall device.

As previously indicated, the gist of the present invention resides in a novel ceramic material for electronic substrates of various types. To better illustrate a preferred method for the preparation of said ceramic material, an example is hereinafter provided for the specific ceramic composition consisting essentially of about 96.0% $Al_2O_3$, 2.0% $SiO_2$, 1.0% MgO, 0.6% $ZrO_2$, and 0.4% $MoO_3$ as calculated from the starting material batch employed to derive said ceramic composition. A 100 gram size batch for said ceramic composition was prepared by dry mixing together 95.7 grams $Al_2O_3$, 0.92 grams $ZrSiO_4$, 1.58 grams talc, and 0.62 grams $SiO_2$ along with 0.4 grams $MoO_3$. The batch was further dry blended in a ball mill for approximately 12 hours after approximately 8 grams of a binder suspended in water was added to said batch. The milled batch was thereafter screened and pressed at approximately 20,000 psi pressure to form the electronic substrate shape above described. The pressed shape was thereafter sintered at approximately 1540° C. for forty minutes in a hydrogen atmosphere furnace to produce the final ceramic article which had a dense black color. Still other ceramic materials of the same type but varying in the $MoO_3$ content are reported in Table I below to further illustrate the color change in optical transmission due to variation in the level of said refractory metal oxide constituent.

TABLE 1

| OXIDE | Examples (Weight Percent) | | | | | | |
|---|---|---|---|---|---|---|---|
| | #1 | #2 | #3 | #4 | #5 | #6 | #7 |
| $Al_2O_3$ | 95.7 | 95.7 | 95.7 | 95.7 | 95.7 | 95.7 | 95.7 |
| $ZrSiO_4$ | 0.92 | 0.92 | 0.92 | 0.92 | 0.92 | 0.92 | 0.92 |
| Talc | 1.58 | 1.58 | 1.58 | 1.58 | 1.58 | 1.58 | 1.58 |
| $SiO_2$ | 1.5 | 1.5 | 1.5 | 1.5 | 1.5 | 1.5 | 1.5 |
| $MoO_3$ | 0.1 | 0.2 | 0.4 | 0.6 | 0.8 | 1.0 | 2.0 |

TABLE 1-continued

| OXIDE | Examples (Weight Percent) | | | | | | |
| --- | --- | --- | --- | --- | --- | --- | --- |
| | #1 | #2 | #3 | #4 | #5 | #6 | #7 |
| Color | Lt. Blue | Dk. Blue | Lt. Black | Dk. Black | Dk. Black | Dk. Black | Dk. Black |

As can be noted from the above reported examples, the desired black color needed to eliminate visible transmission in said ceramic material is not produced at a refractory metal oxide level below about 0.4 weight percent.

It will be apparent from the foregoing description that a generally useful electronic substrate has been provided exhibiting improved optical characteristics. It will be appreciated by those skilled in the art, however, that minor compositional variations can be made in saiad ceramic material without departing from the spirit and scope of the present invention. For example, tungsten oxide can be substituted for molybdenum oxide as the refractory metal oxide component with comparable results. Accordingly, it is intended to limit the scope of the present invention only by the scope of the following claims.

I claim:

1. An improved integrated circuit package comprising an alumina based sintered ceramic member having a central cavity opening in which is disposed an integrated circuit device attached to said ceramic member, said integrated circuit device also being electrically connected to circuit elements of said ceramic member, and cover means for the central cavity opening in said ceramic member, wherein the improvement comprises forming said ceramic member with a sintered body of polycrystalline alumina ceramic having an approximate weight percent based on the starting batch formulation at least 95.7% $Al_2O_3$, about 1-4% aggregate content of $SiO_2$, MgO and $ZrO_2$ glass forming oxides in combination along with about 0.4-2.0% refractory metal oxide selected from molybdenum oxide and tungsten oxide to produce a dense color in the ceramic member which substantially reduces visible transmission in said ceramic member without degrading electrical and physical characteristics, said ceramic having grains of alumina sintered together with a secondary phase containing said $SiO_2$, MgO and $ZrO_2$ constituents disposed at the boundaries of said alumina grains and with said refractory metal oxide also being dissolved in said secondary phase.

2. An improved integrated circuit package as in claim 1 wherein said cover means is formed with the same ceramic material.

* * * * *